United States Patent [19]
Cline et al.

[11] 3,988,757
[45] Oct. 26, 1976

[54] DEEP DIODE ZENERS

[75] Inventors: Harvey E. Cline; Thomas R. Anthony, both of Schenectady, N.Y.

[73] Assignee: General Electric Company, Schenectady, N.Y.

[22] Filed: Apr. 17, 1975

[21] Appl. No.: 568,920

Related U.S. Application Data

[63] Continuation of Ser. No. 411,013, Oct. 30, 1973, abandoned.

[52] U.S. Cl. .................................. 357/13; 357/12; 357/60; 357/86; 357/89; 357/90; 148/1.5
[51] Int. Cl.² .................. H01L 29/88; H01L 29/90; H01L 29/04; H01L 7/00
[58] Field of Search .................. 357/60, 12, 13, 86, 357/89, 90

[56] References Cited
UNITED STATES PATENTS

| | | | |
|---|---|---|---|
| 2,813,048 | 11/1957 | Pfann | 357/60 |
| 3,544,397 | 12/1970 | Weinerth | 357/60 |

Primary Examiner—Edward J. Wojciechowicz
Attorney, Agent, or Firm—Donald M. Winegar; Joseph T. Cohen; Jerome C. Squillaro

[57] ABSTRACT

A deep diode zener has a lamellar structured body of single crystal semiconductor material. The lamellar structure is produced by a thermal gradient zone melting process embodying the thermomigration of metal "wires" through the body to form a region of conductivity opposite to that of the body. The material of the region is recrystallized semiconductor material of the body with solid solubility of the metal of the "wire" to impart the desired type conductivity and resistivity to the region.

25 Claims, 11 Drawing Figures

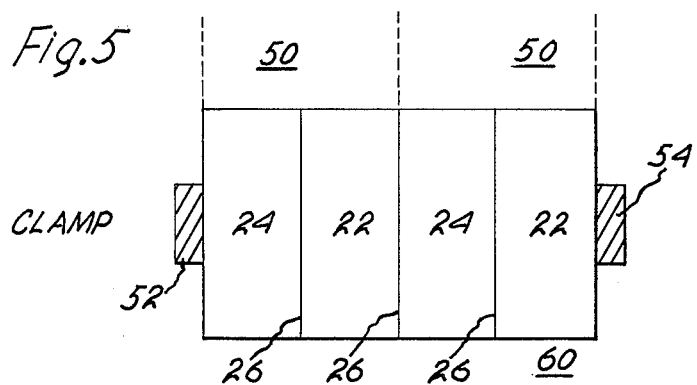
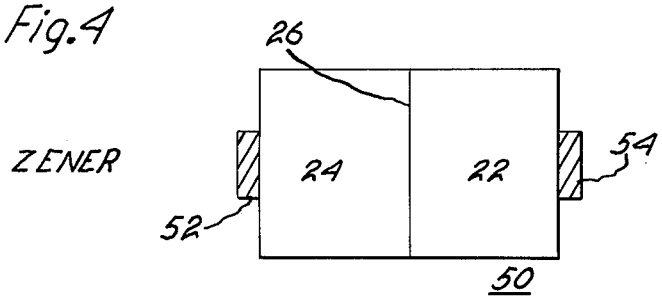
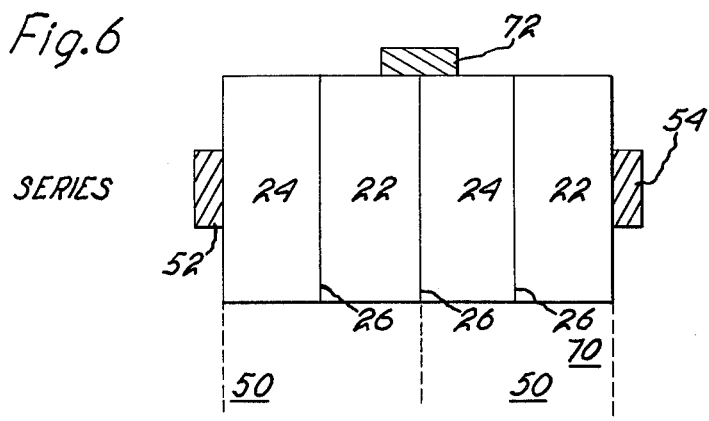
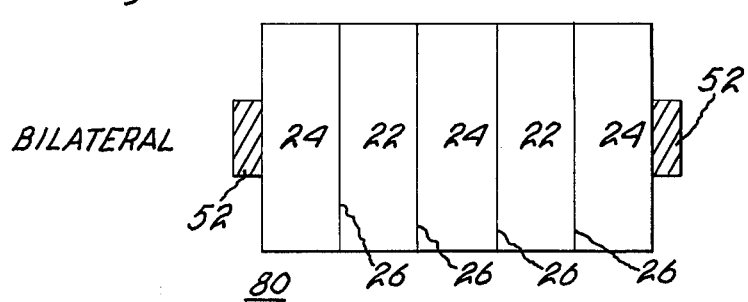

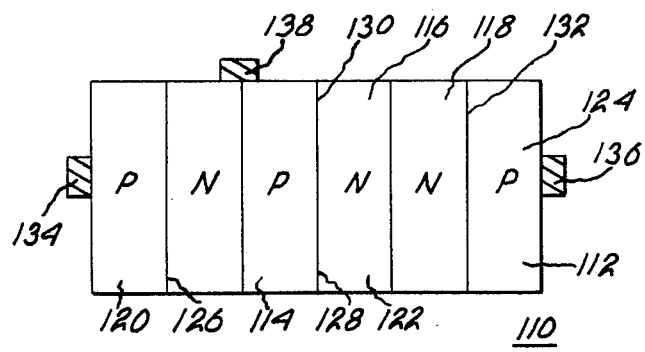
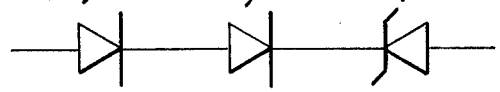
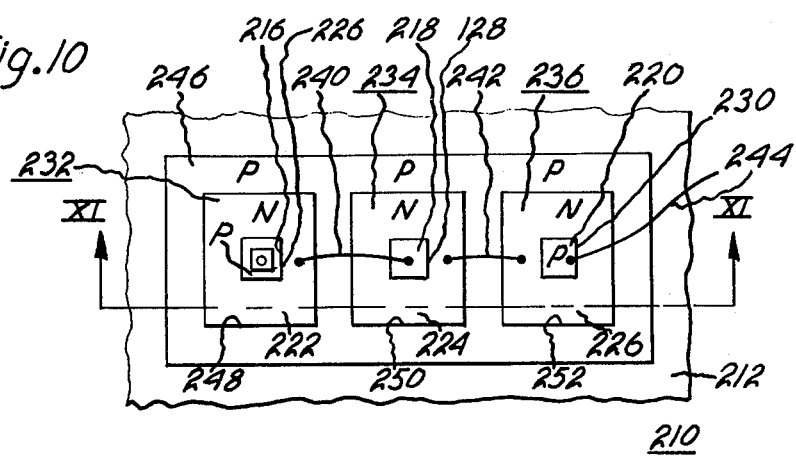
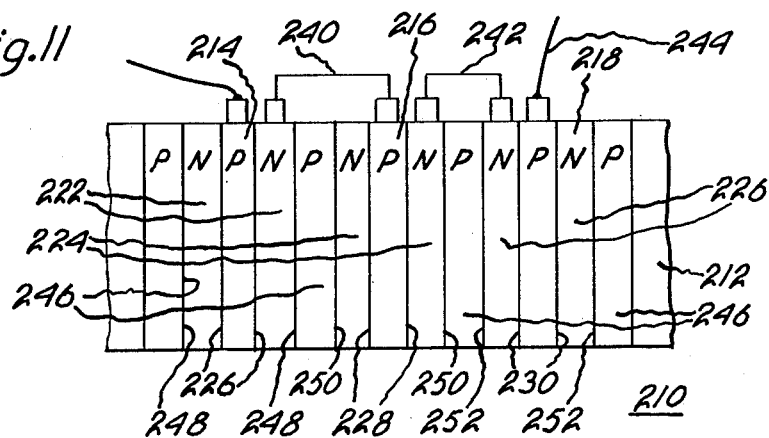

DEEP DIODE ZENERS

This is a continuation of application Ser. No. 411,013, filed Oct. 30, 1973, now abandoned.

BACKGROUND OF THE INVENTION

1. Field of the Invention

This invention relates to zener diodes and more specifically to zener diodes made by a temperature gradient zone melting process.

2. Description of the Prior Art

Heretofore, zener diodes have been made by diffusion processes or epitaxial growth techniques. The diffusion process employed inherently results in P-N junctions which may not be sharply defined and the diffused regions of conductivity do not have a uniform level of resistivity throughout the region. An epitaxial growth process inherently produces solid contaminants which degrade the electrical characteristics of the P-N junction although the region as grown will be substantially of a constant uniform level of resistivity throughout.

Zener diodes rated under eight volts have a temperature coefficient which is dependent on the operating current. One or more forwarded operating diodes are surface series connected to such a zener diode in order to provide temperature compensation. This type circuit arrangement is employed as aa precision voltage reference in control system, digital voltmeters, frequency standards, precision power supplies and other high accuracy applications. However, the necessary physical connections of such a series circuit arrangement, if not substantially perfect are potential sources of high resistance contacts, inherent thermal problems, faulty connections and possibly a failure of the circuit.

An object of this inventionn is to provide a new and improved zener diode which overcomes the deficiencies of prior art zeners.

Another object of this invention is to provide new and improved circuit arrangements embodying one or more zener diodes.

A further object of this invention is to provide a new and improved process for making a zener diode.

A still further object of this invention is to provide a new and improved process for making electrical circuit arrangements embodying one or more zener diodes.

Other objects of this invention will, in part, be obvious and will, in part, appear hereinafter.

BRIEF DESCRIPTION OF THE INVENTION

In accordance with the teachings of this invention, there is provided a deep diode zener comprising a body of single crystal semiconductor material having a lamellar structure of at least one region of first type conductivity and a selected resistivity and at least one region of second and opposite type conductivity and a selected resistivity integral therewith. The material of each of the second regions being recrystallized semiconductor material of the body with solid solubility of a material therein to impart the desired type conductivity and resistivity thereto. A P-N junction if formed by the contiguous surfaces of each mutually adjacent pair of regions of opposite type conductivity. A first electrical contact is affixed to a select one of the regions of first type conductivity. A second electrical contact is affixed to another select one of the regions of second type conductivity. The regions of opposite type conductivity are so arranged that when the P-N junction is reversed biased to a critical voltage, the P-N junction breaks down by tunneling of carriers across the depletion zone and results in a high current flow. The occurrence of the breakdown of the zener diode is dependent upon the doping levels of the regions of opposite type conductivity and the depletion zone widths. Various circuit arrangements are provided embodying lamellar semiconductor devices embodying one or more zener diodes of this invention.

DESCRIPTION OF THE DRAWINGS

FIGS. 4, 5, 6, and 8 are elevation views in cross-section, of various semiconductor devices made in accordance with the teachings of this invention;

FIG. 9 is an electrical schematic of the devices of FIGS. 8 and 10;

FIG. 10 is a top planar view of a device which is another alternate embodiment of the teachings of this invention, and FIG. 11 is an elevation view, partly in cross-section, of the device of FIG. 10 taken along the cutting plane XI—XI.

DESCRIPTION OF THE INVENTION

Figure 1:
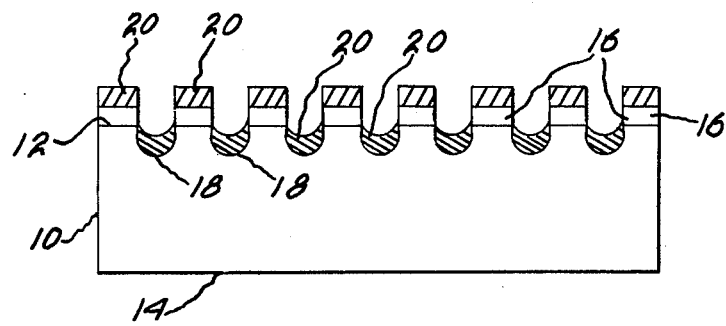
FIGS. 1, 2 and 3 are elevation views, in cross-section, of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a semiconductor compound of a Group II element and a Group VI element and a semiconductor compound of a Group III and a Group V element. In order to described the invention more fully, the body 10 is said to be of silicon semiconductor material.

The electrical characteristics of the resulting zener diodes is dependent upon the dopant levels of the respective regions of opposite type conductivity. Preferably, the body is doped to the level of one of the desired regions of the device.

The body 10 of silicon is mechanically polished, chemically eteched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of spaced lines of a predetermined thickness and spaced a predetermined distance apart is disposed on the layer of photoresist and exposed to ultraviolet light. After exposure, the layer of photoresist is washed in Xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$-HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a mixture of 1 part by volume hydrogen peroxide and 1 part by volume concentrated sulphuric acid.

Selective etching of the exposed surface areas of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° C to 30° C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the metal "wire" to be migrated through the body 10. Etching for approximately 5 minutes at a temperature of 25° C will result in a trough 18 of from 25 to 30 microns in depth for a window width of from 10 to 500 microns. The etched body 10 is rinsed in distilled water and blown dry. Preferably, a gas such, for example, as freon, argon and the like is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impart a second and opposite type conductivity to material of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with 600 grit carbide paper.

It has been discovered that the vapor ddposition of the layer 20 of aluminum metal should be performed at a pressure of approximately $1 \times 10^{-5}$ torr but not greater than $3 \times 10^{-5}$ torr. When the pressure is greater than $3 \times 10^{-5}$ torr, we have found that in the case of aluminum metal deposited in the troughs 18, the aluminum does not penetrate into the silicon and migrate through the body 10. It is believed that the layer of aluminum is saturated with oxygen which prevents reduction of a thin layer of silicon oxide, formed when the silicon surface is exposed to air, by the aluminum and thus, a good wetting of the contiguous surfaces of silicon. The initial melting and alloying of aluminum with silicon required for migration is not obtained because of the inability of aluminum atoms to diffuse into the silicon interface. In a like manner, aluminum deposited by sputtering is not as desirable because sputtered aluminum appears to be saturated with oxygen. The preferred methods of depositing aluminum on the silicon body 10 are by the electron beam method and the like wherein little, if any, oxygen can be trapped in the aluminum.

The processed body 10 is placed in a thermomigration apparatus, not shown, and the metal "wires" in the troughs 18 are migrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 from 700° C to 1350° C. The process is practiced for a sufficient length of time to migrate all the metal "wires" through the body 10. For example, for aluminum wires of 20 microns thickness, a thermal gradient of 50° C/cm, a temperature of the body 10 of 1100° C, and a pressure of $1 \times 10^{-5}$ torr, a furnace time of less than 12 hours is required to migrate the wires through a silicon body 10 of one centimeter thickness.

The temperature gradient zone melting process and apparataus therefore is not a part of this invention. For a more thorough understanding of the temperature gradient zone melting process employed in this invention and for a more thorough description of the apparatus employed for the process, one is directed to our copending applications entitled Method of Making Deep Diode Devices, Ser. No. 411,150; Deep Diode Device Production and Method, Ser. No. 411,021; Deep Diode Devices and Method of Apparatus, Ser. No. 411,001; High Velocity Thermomigration Method of Making Deep Diodes, Ser. No. 411,015; Deep Diode Device Having Dislocation-Free P-N Junctions and Method, Ser. No. 411,009; and The Stablized Droplet Method of Making Deep Diodes Having Uniform Electrical Properties, Ser. No. 411,008, filed concurrently with this patent application and assigned to the same assignee of this invention.

Figure 2:
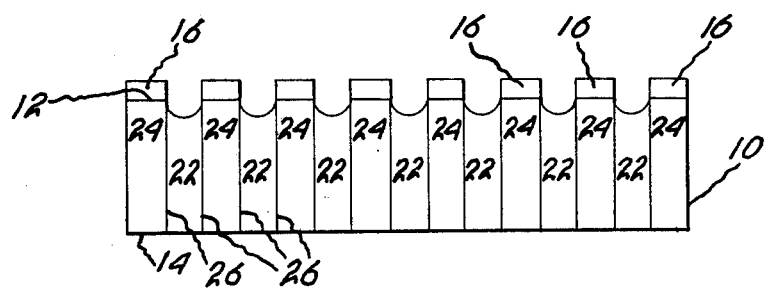

Upon completion of the temperature gradient zone melting process, the aluminum "wires" which have migrated through the body 10 onto the surface 14 are removed by selective etching or grinding. The resulting processed body 10 is as shown in FIG. 2. The thermal migration of the metal "wires" in the troughs 18 through the body 10 produces a body 10 having a lamellar structure of a plurality of spaced regions 22 of a second and opposite type conductivity than the body 10. Each region 22 is recrystallized material of the body 10 suitably doped with a material comprising the metal wire and having an impurity concentration sufficient to obtain the desired conductivity. The metal retained in the recrystallized region is the maximum allowed by the crystalline structure of the material through which it has migrated. It is semiconductor material with a maximum solid solubility of the impurity therein. It is not semiconductor material which has eutectic material therein, and it is not an alloy of the impurity and the semiconductor materials. The region 22 has a constant uniform level of impurity concentration throughout the entire planar region. The thickness of the region 22 is substantially constant for the entire region. The peripheral surface of each planar region 22 comprises in part the top surface 12, the bottom surface 14 and the peripheral side surfaces 30 and 32 of the body 10.

Additionally the body 10 is divided into a plurality of spaced regions 24 having the same or first type conductivity as the body 10. A P-N junction 26 is formed by the contiguous surfaces of each pair of mutually adjacent regions 22 and 24 of opposite type conductivity. At a 1100° C processing temperature, the number of acceptors decreases from $2 \times 10^{19}$ to $5 \times 10^{14}$, the concentration of donors in the N material, in a distance of 18 microns to form a P-N junction 26 which is abrupt and distinct. At lower processing temperatures the junction width 26 is smaller being of the order of 0.3 microns for a process furnace temperature of approximately 900° C.

Figure 3:
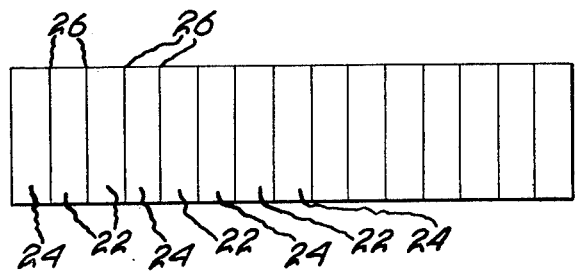

The resulting structure is one large area semiconductor device having a plurality of planar regions of alternate type conductivity as shown in FIG. 3. The structure may also be divided into a plurality of chips having a similar configuration.

Referring now to FIG. 4, there is shown a zener diode 50 embodying a region 24 and a region 22 and a P-N junction 26 therebetween. An ohmic electricl contact 52 is affixed to the region 24 and an ohmic electrical contact 54 is affixed to region 22. The zener diode 50 is employed to regulate or protect circuits against DC transients.

With reference to FIG. 5, there is shown two integral zener diodes 50 which function as a voltage clamp 60. The items denoted by the same reference numerals as employed in FIG. 4 are the same, and function in the same manner as heretofore described. The clamp 60 is fabricated by cutting four alternate regions 22 and 24 from the processed body of FIG. 3. The clamp 60 protects circuits against AC voltage.

Other zener diodes configurations are also possible by employing variations of the lamellar structure of FIG. 3. For example, two or more zener diodes may be electrically connected in a series circuit relationship to increase the overall voltage operation of zener diode. Referring now to FIG. 6, there is shown an example of a zener diode 70 which embodies two zener diodes 50 which are integral with each other. An ohmic electrical contact 72 is affixed to selected surface areas of the region 22 of one zener diode and the region 24 of the other zener diode 50. The exposed portion of the P-N junction 26 there between. The contact 72 electrically shunts the P-N junction 26 and effectively the functioning voltage of the zener diode 70 is equal to the series of the two individual zener diodes 50.

With reference to FIG. 7, there is shown a bilateral zener diode 80 made from the lamellar structure of the device of FIG. 3. The operation of bilateral zener diode 80 is similar to that of the zener diode clamp 60.

The voltage ratings of the zener diodes, as stated before, is a function of the doping levels of each region 22 and 24. The resistivities are achieved by thermomigrating metal "wires" of appropriate metal composition through a body of semiconductor material of opposite type conductivity and desired resistivity. If required, the original material of the body 10 may be further modified as required by the thermomigration of metal "wires" there-through to alter the original resistivity but still retain the original type resistivity.

The process of making zener diodes in accordance with the teachings of this invention is particularly useful in making a variety of solid state circuits having a lamellar structure. For example, the effect of temperature in the operating voltage is critical for a zener diode used as a precision voltage reference in control systems, digital voltmeters, frequency standards, precision power supplies and other similar high-accuracy applications. Zener diodes which have a voltage rating of approximately 5 volts may have a temperature coefficient of approximately zero. However, zener diodes which a voltage rating under eight volts have a temperature coefficient which is dependent upon the operating current of the circuit. Therefore, it is possible for zeners of approximately 5 volt rating to have a negative coefficient at a low current, a zero coefficient at an intermediate current and a positive coefficient at a high current. It is appropriate therefore, to operate such precision reference zener diodes at a specified current.

To accomplish this end one or more forward-biased diodes are connected in series with a zener diode to provide temperature compensation therefore. One may achieve this result with a body of semiconductor material having a lamellar structure. Referring now to FIG. 8, there is shown a solid state circuit 110. The circuit 110 comprises a body of semiconductor material 112 having a lamellar structure produced by the thermomigration of metal "wires" in accordance with the teachings of this invention and our copending applications mentioned heretofore. The body 112 comprises P-type semiconductor material in which N-type regions 114, 116 and 118 are formed. The regions 114 and 116 has the same resistivity and the region 118 is highly doped to produce a $N^+$ region. P-type conductivity regions 120 and 122 have the same resistivity and may be the original material of the body 112. Region 124 is preferably highly doped by thermomigration to produce a $P^+$ region for the zener operation. P-N junctions 126, 128 and 130 and 132 are formed by the contiguous surfaces of respective regions 120 and 114, 114 and 122, 122 and 116, and 118 and 132 of opposite type conductivity. Ohmic electrical contacts 134 and 136 are affixed to respective regions 120 and 112 to complete the circuit 110. An ohmic electrical contact 138 is affixed to selected surface area of regions 114 and 122 and the exposed portion of the P-N junction 128 therebetween. The contact 138 electrically shunts the P-N junction 128 and effectively series connects the two integral forward-biased diodes. Regions 118 and 132 function as a zener diode. The equivalent electrical circuit is shown in FIG. 9.

Alternatively, zener diodes may be made by the thermomigration of metal droplets through a body of semiconductor material to produce a columnar structural diode having zener characteristics. Again, the resistivities for each region is selected for the desired voltage rating of zener diode. Similarly, forward-biased diodes are produced in the same manner. Therefore, by interconnecting the diodes, the equivalent circuit of FIG. 9 may be duplicated in another manner. Referring now to FIGS. 10 and 11, there is shown a solid state circuit 210 which is part of an integrated circuit. The circuit 210 is formed in substrate 212 common to all the circuits. Metal droplets are thermomigrated through the substrate 216 in a manner similar to the thermomigration of the metal series. The composition of the metal droplets is appropriate to produce the desired resistivity and P-type conductivity for regions 214, 216 and 218. N-type regions 220, 222 and 224 are the original material of the substrate 212 or made by the thermomigration of metal wires in accordance with preferred planar orientations and line directions to be described later. The regions 220, 222 and 224 have desired resistivities for the voltage and type diode requirements. P-N junctions 226, 228 and 230 are formed by the contiguous surfaces of the respective pairs of regions 216 and 222, 218 and 224, and 220 and 226 of opposite type conductivity. Forward-biased diodes 232 and 234 are formed by the respective pairs of regions 216 and 222 and regions 218 and 224. Regions 220 and 226 are tailored to function as zener diode. The circuit 210 is completed by electrical leads 238, 240, 242 and 244 interconnected the diodes and the zener diode in a series circuit and to enable the circuit 210 to be connected electrically into circuitry external thereto. Electrical isolation region 246 is formed by the thermomigration of metal wires to form the P-type isolation region in the contiguous surfaces of substrate 212 and the isolation region 246. Electrical isolation of the diodes 232, 234 and 236 from each is completed by the respective P-N junctions 248, 250 and 252.

The material of the metal droplets employed to form the various regions 216, 218 and 220 should not be allowed to solidify within the body 10. Solidification of the droplet within the substrate 212 may cause severe internal stresses, even fractures of the materials which detrimentally affects the physical characteristics of the substrate 212. Complete failure of the processed circuit 210 is possible.

It has been discovered that when the substrate 212 of silicon, germanium, silicon carbide, gallium arsenide semiconductor material and the like, the migrating metal droplet has a preferred shape which also gives rise to the regions being formed to have the same shape as the migrating droplet. In a crystal axis direction of <111> of thermal migration, the droplet migrates as a triangular platelet laying in a (111) plane. The platelet is bounded on its edges by (112) planes. A droplet larger than 0.10 centimeter on an edge is unstable and breaks up into several droplets during migration. A droplet smaller than 0.0175 centimeter does not migrate into the substrate 212 because of a surface barrier problem.

The ratio of the droplet migration rate over the imposed thermal gradient is a function of the temperature at which thermomigration of the droplet is practiced. At high temperatures, of the order of from 1000° C to 1400° C, the droplet migration velocity increases rapidly with increasing temperature. A velocity of 10 centimeters per day of $1.2 \times 10^{116\ 4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet thermomigrates in the <100> crystal axis direction as a pyramidal bounded by four forward (111) planes and a rear (100) plane. Careful control of the thermal gradient and migration rate is a necessity. Otherwise, a twisted region may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted into a trapezoidal shape.

For a more thorough understanding of the temperature gradient zone melting process and the apparatus employed for process, one is desired to our aforementioned copending patent applications. Copending applications "Isolation Junctions With Semiconductor Devices", Ser. No. 411,012 and "Thermomigration of Metal-rich Liquid Wires Through Semiconductor Materials", Ser. No. 411,018, describe the isolation grid and its process.

The thermomigration of metal wires is preferably practiced in accordance with the planar orientations, thermomigration directions, stable wire directions and stable wire sizes of Table I.

Table I

| Wafer Plane | Migration Direction | Stable Wire Directions | Stable Wire Sizes |
|---|---|---|---|
| (100) | <100> | <011>* | <100 microns |
|  |  | <0$\bar{1}$1>* | <100 microns |
| (110) | <110> | <1$\bar{1}$0>* | <150 microns |
| (111) | <111> | a) <01$\bar{1}$> |  |
|  |  | <$\bar{1}$0$\bar{1}$> | <500 microns |
|  |  | <1$\bar{1}$0> |  |
|  |  | b) <11$\bar{2}$>* |  |
|  |  | <$\bar{2}$11>* | <500 microns |
|  |  | <1$\bar{2}$1>* |  |
|  |  | c) Any other* Direction in (111) plane* | <500 microns |

*The stability of the migrating wire is sensitive to the alignment of the thermal gradient with the <100>, <110> and <111> axis, respectively.
+ Group a is more stable than group b which is more stable than group c.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

We claim as our invention:

1. A deep zener semiconductor diode comprising:
    a body of single crystal semiconductor material having a first type conductivity, a predetermined level of resistivity, two major opposed surfaces which are, respectively, the top and bottom surfaces thereof, and a vertical axis which is substantially parallel with a first crystal axis of the material of the body;
    at least one of the major surfaces having a preferred planar crystal orientation which is one selected from the group consisting of (111), (110) and (100);
    a lamellar structure of a plurality of integral alternate first and second regions of different and opposite type conductivity formed in situ in the body;
    each region extending between, and terminating in, the opposed major surfaces and having opposed end surfaces, each end surface being coextensive with only one respective major surface;
    a P-N junction formed by the contiguous surfaces of the material of each pair of abutting regions of opposite type conductivity, the P-N junction being substantially parallel with the first crystal axis and having end portions exposed at the opposed major surfaces;
    the material of each first region being a portion of the material of the body.
    the material of each second region consisting of recrystallized semiconductor material of the body formed in situ by the migration of a melt of metal-rich semiconductor material of the body through the entire body from one opposed major surface of the other by thermal gradient zone melting at a predetermined elevated temperature along a thermal gradient substantially parallel with the first preferred crystal axis and the vertical axis of the body and having a predetermined level of concentration of the metal of the melt distributed substantially uniformly throughout the entire region, the level of concentration of the metal being determined by the solid solubility limit of that metal in that semiconductor material at that predetermined elevated temperature of migration, the metal comprising at least one dopant impurity material for inparting the type conductivity and a predetermined level of resistivity to the recrystallized material of the region;

a pair of mutually adjacent regions of opposite type conductivity comprising a zener diode;

a first electrical contact affixed to, and in an electrically conductive relationship with, the first region of the zener diode;

a second electrical contact affixed to, and in an electrically conductive relationship with, the second region of the zener diode, and the predetermined level of resistivity of each of the first and second regions of the zener diode are so arranged that when the P-N junction therebetween is reversed bias to a critical voltage, the P-N junction breaks down by the tunneling of carriers across the depletion zone and results in a high current flow, the occurrence of the breakdown being dependent upon the level of resistivity of the regions of opposite type conductivity and the depletion zone widths which occurs during functioning of the zener diode.

2. The deep diode zener of claim 1 wherein the first and second regions of opposite type conductivity are planar regions, each planar regions having a longitudinal axis which is aligned substantially parallel with a preferred second crystal axis of the material of the body, and each of the second regions has a substantially constant uniform resistivity throughout the region.

3. The deep diode zener of claim 1 wherein the semiconductor material is one selected from the group consisting of silicon, silicon carbide, gallium arsenide and germanium.

4. The deep diode zener of claim 2 wherein the semiconductor material is one selected from the group consisting of silicon, silicon carbide, gallium arsenide and germanium, and the dopant impurity is aluminum.

5. The deep diode zener of claim 2 wherein the semiconductor material is silicon, and the dopant impurity is aluminum.

6. The deep diode zener of claim 1 wherein the lamellar structure comprises four regions of alternate and opposite type conductivity, the first and third regions being of the first type conductivity, and the second and fourth regions being of the second type conductivity, and the first electrical contact is affixed to the first region, and the second electrical contact is afixed to the fourth region.

7. The deep diode zener of claim 6 including a third electrical contact affixed to selective surface areas of the second and third regions and a portion of the P-N junction exposed therebetween to electrically shunt the P-N junction.

8. The deep diode zener of claim 1 wherein the lamellar structure comprises five alternate regions of different and opposite type conductivity, the first, third and fifth regions being of the first type conductivity, and the second and fourth regions being of the second type conductivity, the first electrical contact is affixed to the first region, and the second electrical contact is affixed to the fifth region.

9. The semiconductor device of claim 1 wherein the material of the body is silicon, silicon carbide, germanium and gallium arsenide.

10. The semiconductor device of claim 1 wherein the opposed major surfaces have a preferred planar crystal orientation of (100), the first crystal axis is $<100>$, and the preferred second crystal axis is one selected from the group consisting of $<011>$ and $<0\bar{1}1>$.

11. The semiconductor device of claim 10 wherein the material of the body is silicon, silicon carbide, germanium and gallium arsenide.

12. The semiconductor device of claim 1 wherein the opposed major surfaces have a preferred planar crystal orientation of (110), the first crystal axis is $<110>$, and the preferred second crystal axis is $<1\bar{1}0>$.

13. The semiconductor devices of claim 12 wherein the material of the body is silicon, silicon carbide, germanium and gallium arsenide.

14. The semiconductor device of claim 1 wherein the opposed major surfaces have a preferred planar crystal orientation of (111), the first crystal axis is $<111>$, and the preferred second crystal axis is one selected from the group consisting of $<11\bar{2}>$, $<\bar{2}11>$, $<1\bar{2}1>$, $<01\bar{1}>$, $<10\bar{1}>$ and $<1\bar{1}0>$.

15. The semiconductor device of claim 14 wherein the material of the body is silicon, silicon carbide, germanium and gallium arsenide.

16. The deep zener semiconductor diode of claim 1 wherein the solid solubility of the at least one dopant impurity material provides the substantially constant level of impurity concentration in the second regions.

17. The deep diode zener of claim 1 wherein the lamellar structure comprises six abutting regions, the second, fourth and fifth regions each having first type conductivity, the first, third and sixth regions each having second type conductivity, the first electrical contact is affixed to the first region, the second electrical contact is affixed to the sixth region, and a third electrical contact is affixed to, and in an electrical conductive relationship with, selective surface areas of the second and third regions and that end portion of the P-N junction therebetween and exposed at the surface, thereby forming a series electrical circuit of two diodes electrically connected to each other and a zener diode electrically connected to one of the diodes.

18. A deep zener semiconductor diode comprising a body of single crystal semiconductor material having two major opposed surfaces which are respectively, the top and bottom surfaces thereof, a predetermined level of resistivity, a vertical axis which is substantially parallel with a first crystal axis of the material of the body and a first type conductivity;

at least one of the major surfaces having a preferred planar crystal orientation which is one selected from the group consisting of (111), (110) and (100);

at least one columnar region of second type conductivity and a predetermined level of resistivity disposed within the body, extending between, and terminating in, the opposed major surfaces;

each columnar region consisting of recrystallized semiconductor material of the body formed in situ in the body by the migration of a melt of metal-rich semiconductor material of the body through the entire body from one opposed major surface to the other by thermal gradient zone melting at a predetermined elevated temperature along a thermal gradient substantially parallel with the preferred first crystal axis and the vertical axis of the body and having a predetermined level of concentration of the metal of the melt distributed substantially uniformly throughout the entire region, the level of concentration of the metal being determined by the solid solubility limit of that metal in the semiconductor material at that predetermined elevated temperature of migration, the metal comprising at least one dopant impurity material for imparting the predetermined level of resistivity and type conductivity thereto;

A P-N junction formed by the contiguous surfaces of the abutting material of opposite type conductivity of the region and the body;

a first electrical contact affixed to the body, and a plurality of second electrical contacts, each contact being affixed to a surface of only one of the columnar regions, whereby the regions of opposite type conductivity are so arranged that when the P-N junction between two mutually adjacent regions of opposite type conductivity is reversed biased a depletion zone is formed which increases in width with increasing positive voltage and suddenly breaks down and results in a high current flow, the occurence of the breakdown being dependent upon the level of resistivity of each of the regions of opposite type conductivity and the depletion zone widths.

19. The deep diode zener of claim 18 wherein each of the second regions has a substantially constant uniform resistivity throughout the region.

20. The deep diode zener of claim 19 wherein the body is of N-type conductivity and has a resistivity of less than approximately 0.02 ohm-centimeter, and the columnar region is of P-type conductivity and has a resistivity of less than 0.07 ohm-centimeter.

21. The deep diode zener of claim 18 wherein the semiconductor material is one selected from the group consisting of silicon, silicon carbide, gallium arsenide and germanium.

22. The deep diode zener of claim 19 wherein the semiconductor material is one selected from the group consisting of silicon, silicon carbide, gallium arsenide and germanium, and the dopant impurity is aluminum.

23. The deep diode zener of claim 20 wherein the semiconductor material is silicon, and the dopant impurity is alumunium.

24. The deep diode zener of claim 18 wherein the deep diode zener comprises a plurality of first and second concentric abutting regions of alternate and opposite type conductivity, one of the first regions being concentric with one of the columnar regions;

each of the first and second regions extending between, and terminating in, the opposed major surfaces of the body and each first region having a selective resistivity and the same type conductivity as the body.

25. The deep diode zener of claim 24 wherein each of the second regions has a substantially constant uniform resistivity.

* * * * *